United States Patent
Coteus et al.

(10) Patent No.: US 7,330,996 B2
(45) Date of Patent: Feb. 12, 2008

(54) TWIN-TAILED FAIL-OVER FOR FILESERVERS MAINTAINING FULL PERFORMANCE IN THE PRESENCE OF A FAILURE

(75) Inventors: Paul W. Coteus, Yorktown Heights, NY (US); Alan G. Gara, Mount Kisco, NY (US); Mark E. Giampapa, Irvington, NY (US); Philip Heidelberger, Cortlandt Manor, NY (US); Burkhard D. Steinmacher-Burow, Mount Kisco, NY (US)

(73) Assignee: International Business Machines Corporation, Armonk, NY (US)

( * ) Notice: Subject to any disclaimer, the term of this patent is extended or adjusted under 35 U.S.C. 154(b) by 688 days.

(21) Appl. No.: 10/468,990

(22) PCT Filed: Feb. 25, 2002

(86) PCT No.: PCT/US02/05614

§ 371 (c)(1),
(2), (4) Date: Aug. 22, 2003

(87) PCT Pub. No.: WO02/069162

PCT Pub. Date: Sep. 6, 2002

(65) Prior Publication Data

US 2004/0073830 A1    Apr. 15, 2004

Related U.S. Application Data

(60) Provisional application No. 60/271,124, filed on Feb. 24, 2001.

(51) Int. Cl.
*G06F 11/00* (2006.01)
*G06F 11/20* (2006.01)

(52) U.S. Cl. .............. 714/3; 714/9; 714/10; 714/13
(58) Field of Classification Search ............ 714/3, 714/10, 13, 9
See application file for complete search history.

(56) References Cited

U.S. PATENT DOCUMENTS 5,526,492 A * 6/1996 Ishida ............... 709/228
5,566,297 A * 10/1996 Devarakonda et al. ....... 714/15
5,675,723 A * 10/1997 Ekrot et al. ............... 714/4

(Continued)

OTHER PUBLICATIONS

A Simple Client-Server System Using a Personal Computer as the Server by Matsummura, Anada, Antoku, Journal of Medical Systems vol. 24 No. 1, 2000 Plenum Publishing Corporation 2000.*

*Primary Examiner*—Scott Baderman
*Assistant Examiner*—Joseph Schell
(74) *Attorney, Agent, or Firm*—Scully, Scott, Murphy & Presser, P.C.; Daniel P. Morris, Esq,

(57) ABSTRACT

A method for maintaining full performance of a file system in the presence of a failure is provided. The file system having N storage devices, where N is an integer greater than zero and N primary file servers where each file server is operatively connected to a corresponding storage device for accessing files therein. The file system further having a secondary file server operatively connected to at least one of the N storage devices. The method including: switching the connection of one of the N storage devices to the secondary file server upon a failure of one of the N primary file servers; and switching the connections of one or more of the remaining storage devices to a primary file server other than the failed file server as necessary so as to prevent a loss in performance and to provide each storage device with an operating file server.

17 Claims, 6 Drawing Sheets

U.S. PATENT DOCUMENTS

| | | | |
|---|---|---|---|
| 5,696,895 A * | 12/1997 | Hemphill et al. | 714/4 |
| 5,812,748 A * | 9/1998 | Ohran et al. | 714/4 |
| 5,812,751 A * | 9/1998 | Ekrot et al. | 714/4 |
| 5,852,724 A * | 12/1998 | Glenn et al. | 709/239 |
| 5,930,823 A * | 7/1999 | Ito et al. | 711/152 |
| 5,954,694 A * | 9/1999 | Sunseri | 604/96.01 |
| 5,978,565 A * | 11/1999 | Ohran et al. | 714/13 |
| 5,996,086 A * | 11/1999 | Delaney et al. | 714/4 |
| 6,412,079 B1 * | 6/2002 | Edmonds et al. | 714/11 |
| 6,728,897 B1 * | 4/2004 | Cramer et al. | 714/6 |
| 6,745,341 B1 * | 6/2004 | Onitsuka et al. | 714/7 |
| 6,845,467 B1 * | 1/2005 | Ditner et al. | 714/11 |
| 6,874,103 B2 * | 3/2005 | Cepulis | 714/13 |
| 6,990,547 B2 * | 1/2006 | Ulrich et al. | 710/304 |

* cited by examiner

TWIN-TAILED FAIL-OVER FOR FILESERVERS MAINTAINING FULL PERFORMANCE IN THE PRESENCE OF A FAILURE

CROSS REFERENCE TO RELATED APPLICATIONS

The present invention claims the benefit of commonly-owned, co-pending United States Provisional Patent Application Ser. No. 60/271,124 filed Feb. 24, 2001 entitled MASSIVELY PARALLEL SUPERCOMPUTER, the whole contents and disclosure of which is expressly incorporated by reference herein as if fully set forth herein. This patent application is additionally related to the following commonly-owned, co-pending United States Patent Applications filed on even date herewith, the entire contents and disclosure of each of which is expressly incorporated by reference herein as if fully set forth herein. U.S. patent application Ser. No. 10/468,999, for "Class Networking Routing"; U.S. patent application Ser. No. 10/469,000, for "A Global Tree Network for Computing Structures"; U.S. patent application Ser. No. 10/468,997, for 'Global Interrupt and Barrier Networks"; U.S. patent application Ser. No. 10/469,001, for 'Optimized Scalable Network Switch"; U.S. patent application Ser. No. 10/468,991, for "Arithmetic Functions in Torus and Tree Networks'; U.S. patent application Ser. No. 10/468,992, for 'Data Capture Technique for High Speed Signaling"; U.S. patent application Ser. No. 10/468,995, for 'Managing Coherence Via Put/Get Windows'; U.S. patent application Ser. No. 10/468,994, for "Low Latency Memory Access And Synchronization"; U.S. patent application Ser. No. 10/468,990, for 'Twin-Tailed Fail-Over for Fileservers Maintaining Full Performance in the Presence of Failure"; U.S. patent application Ser. No. 10/468,996, for "Fault Isolation Through No-Overhead Link Level Checksums'; U.S. patent application Ser. No. 10/469,003, for "Ethernet Addressing Via Physical Location for Massively Parallel Systems"; U.S. patent application Ser. No. 10/469,002, for "Fault Tolerance in a Supercomputer Through Dynamic Repartitioning"; U.S. patent application Ser. No. 10/258,515, for "Checkpointing Filesystem"; U.S. patent application Ser. No. 10/468,998, for "Efficient Implementation of Multidimensional Fast Fourier Transform on a Distributed-Memory Parallel Multi-Node Computer"; U.S. patent application Ser. No. 10/468,993, for "A Novel Massively Parallel Supercomputer"; and U.S. patent application Ser. No. 10/083,270, for "Smart Fan Modules and System".

This invention was made with Government support under subcontract number B517552 under prime contract number W-7405-ENG-48 awarded by the Department of Energy. The Government has certain rights in this invention.

BACKGROUND OF THE INVENTION

1. Field of the Invention

The present invention relates generally to a fail-over system and method for fileservers, and more particularly, to distributed memory message passing parallel computer design and system software, as applied for example to computation in the field of life sciences.

2. Prior Art

Systems and methods are known in the art for providing a fail-over upon the failure of a fileserver in a parallel computer design. However, such systems and methods provide a fail-over at the cost of a reduction in system performance. As a result, the fail-over systems and methods of the prior art are not transparent to the application being run by the computer, either in terms of total performance or in input/output (I/O) connectivity.

SUMMARY OF THE INVENTION

Therefore it is an object of the present invention to provide fail-over systems and methods for a file system, which overcome the disadvantages associated with the prior art.

Accordingly, a file system for a computer is provided. The file system comprising: N storage devices, where N is an integer greater than zero; N primary file servers, each file server being operatively connected to a corresponding storage device for accessing files therein; and a secondary file server operatively connected to at least one of the N storage devices; wherein upon a failure of one of the N primary file servers, one of the N storage devices switches its connection to the secondary file server and one or more of the remaining storage devices switch their connections to a primary file server other than the failed file server as necessary so as to prevent a loss in performance and to provide each storage device with an operating file server.

In a preferred implementation of the file system, each of the N storage devices comprises a plurality of disk drives. The plurality of disk drives preferably comprises a reliable array of inexpensive disks (RAID). In a further preferred implementation of the file system, each of the N primary and the secondary file servers are a PC.

Preferably, at least one of the N storage devices has first and second connections, where the first connection operatively connects the storage device to one of the primary file servers and the second connection operatively connects the storage device to the secondary file server. The first and second connections are preferably SCSI bus connections. Preferably, at least one of the primary and the secondary file servers have a two-channel SCSI controller, one of the two-channels being operatively connected to one of the N storage devices and the other of the two-channels being operatively connected to another of the N storage devices.

Also provided is a computer system. The computer system comprising: I/O nodes operatively connected to a file system; the file system comprising, N storage devices, where N is an integer greater than zero, N primary file servers, each file server being operatively connected to a corresponding storage device for accessing files therein; and a secondary file server operatively connected to at least one of the N storage devices, wherein upon a failure of one of the N primary file servers, one of the N storage devices switches its connection to the secondary file server and one or more of the remaining storage devices switch their connections to a primary file server other than the failed file server as necessary so as to prevent a loss in performance and to provide each storage device with an operating file server.

In a preferred implementation of the computer system, each of the N storage devices comprises a plurality of disk drives. The plurality of disk drives preferably comprises a reliable array of inexpensive disks (RAID). In a further preferred implementation of the computer system, each of the N primary and the secondary file servers are a PC.

Preferably, at least one of the N storage devices has first and second connections, where the first connection operatively connects the storage device to one of the primary file servers and the second connection operatively connects the storage device to the secondary file server. The first and second connections are preferably SCSI bus connections. Preferably, at least one of the primary and the secondary file servers have a two-channel SCSI-controller, one of the two-channels being operatively connected to one of the N storage devices and the other of the two-channels being operatively connected to another of the N storage devices.

Further provided a method for maintaining full performance of a file system in the presence of a failure. The file system having N storage devices where N is an integer greater than zero and N primary file servers where each file server is operatively connected to a corresponding storage device for accessing files therein. The file system further having a secondary file server operatively connected to at least one of the N storage devices. The method comprising: switching the connection of one of the N storage devices to the secondary file server upon a failure of one of the N primary file servers; and switching the connections of one or more of the remaining storage devices to a primary file server other than the failed file server as necessary so as to prevent a loss in performance and to provide each storage device with an operating file server. Thus, the method switches the connections in such a way that there is no loss in performance and the resulting load on the file servers is equalized.

Still further provided is a computer program product embodied in a computer-readable medium for maintaining full performance of a file system in the presence of a failure. The file system having N storage devices where N is an integer greater than zero and N primary file servers where each file server is operatively connected to a corresponding storage device for accessing files therein. The file system further having a secondary file server operatively connected to at least one of the N storage devices. The computer program product comprising: computer readable program code means for switching the connection of one of the N storage devices to the secondary file server upon a failure of one of the N primary file servers; and computer readable program code means for switching the connections of one or more of the remaining storage devices to a primary file server other than the failed file server as necessary so as to prevent a loss in performance and to provide each storage device with an operating file server. Therefore, as discussed above, the connections are switched in such a way that there is no loss in performance and that the resulting load on the file servers is equalized.

Still yet further provided is a program storage device readable by machine, tangibly embodying a program of instructions executable by the machine to perform method steps for maintaining full performance of a file system in the presence of a failure. The file system having N storage devices where N is an integer greater than zero and N primary file servers where each file server is operatively connected to a corresponding storage device for accessing files therein. The file system further having a secondary file server operatively connected to at least one of the N storage devices. The method comprising: switching the connection of one of the N storage devices to the secondary file server upon a failure of one of the N primary file servers; and switching the connections of one or more of the remaining storage devices to a primary file server other than the failed file server as necessary so as to prevent a loss in performance and to provide each storage device with an operating file server. Therefore, the method comprises switching the connections in such a way that there is no loss in performance and that the resulting load on the file servers is equalized.

BRIEF DESCRIPTION OF THE DRAWINGS

These and other features, aspects, and advantages of the apparatus and methods of the present invention will become better understood with regard to the following description, appended claims, and accompanying drawings where:

DETAILED DESCRIPTION OF THE PREFERRED EMBODIMENT

Although this invention is applicable to numerous and various types of fail-over systems, it has been found particularly useful in the environment of fail-over systems for massively parallel computers. Therefore, without limiting the applicability of the invention to fail-over systems for massively parallel computers, the invention will be described in such environment. Such a massively parallel computer system is described in co-pending U.S. patent applications, Ser. Nos. 10/468,991; 10/468,992; 10/468,995; 10/468,994; 10/468,998; 10/083,270; 10/468,999; 10/469,000; 10/468,997; 10/469,001; 10/469,002; 10/468,993; 10/469,996; 10/469,003; 10/258,515; the entire disclosures of which are incorporated herein by their reference.

Figure 1:
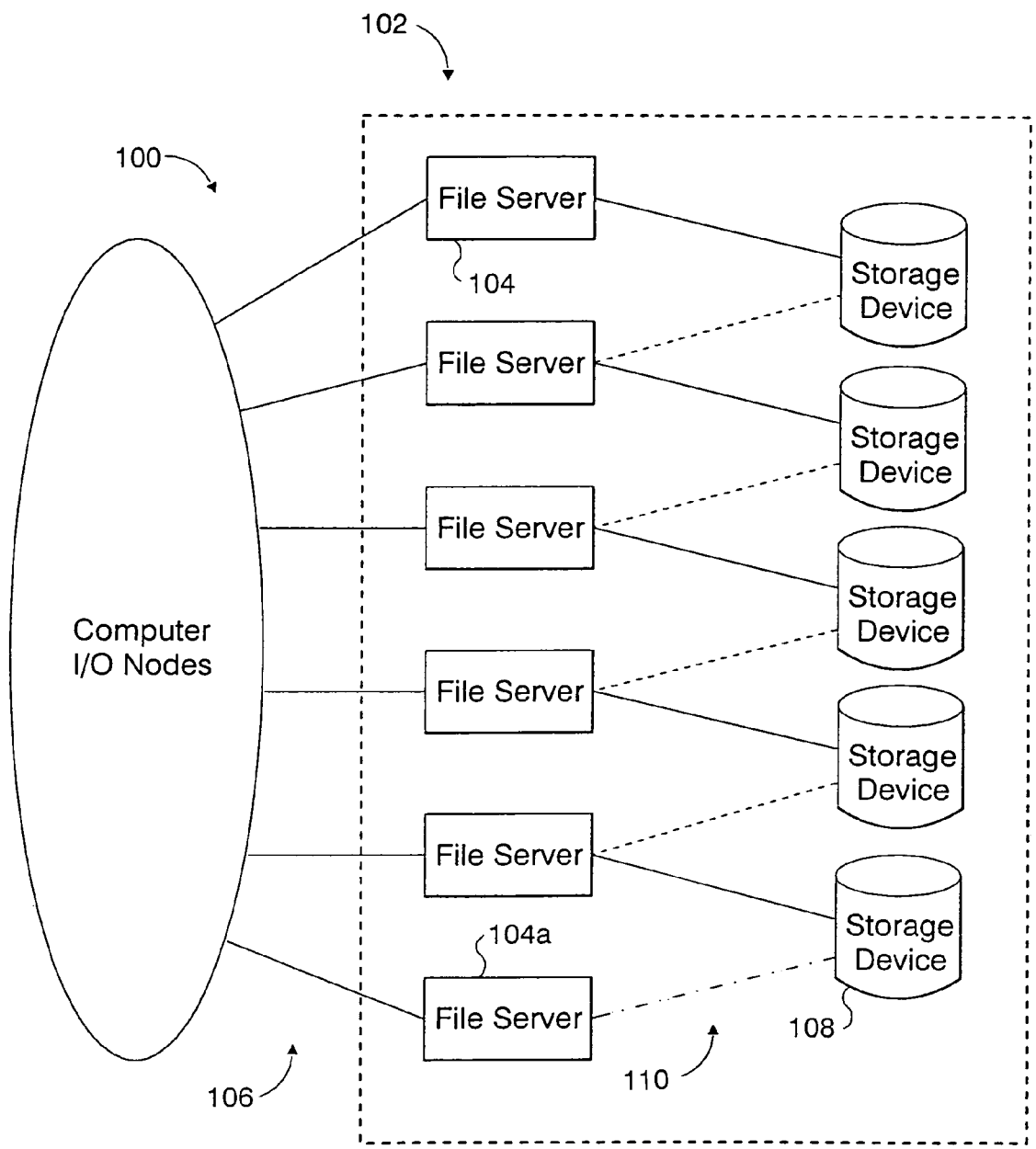
FIG. 1 illustrates a normal operating mode of I/O nodes and file system of a computing system according to a preferred implementation of the present invention.

Referring now to FIG. 1, a computer system is shown therein and generally referred to by reference numeral 100. The computer system 100 uses a combination of hardware and software architecture and algorithms to solve the problems associated with the prior art described above. The computer system 100 includes a file system 102 arranged in a number of "N/N+1 Fail-Over Clusters", where each fail-over cluster contains one processor, alternatively referred to as a file server 104, per I/O node 106, plus at least one on-line spare file server 104a. In a preferred implementation, the computer 100 is a massively parallel system and the file system employs rack-mount commodity PCs as file servers 104.

Each file server 104, including the spare 104a, has direct access to two or more storage devices 108. Although, FIG. 1 illustrates each file server 104 directly accessing two storage devices 108, such a configuration is shown as a preferred implementation and not to limit the spirit or scope of the present invention. However, as is described below, each file server 104 can directly access more than two storage devices 108. Preferably, each of the file servers 104 contains a two-channel SCSI controller. In such a preferred configuration, one of the SCSI channels is designated the "Primary" interface to a storage device 108, and the other is placed in hot standby, or "Fail-Over", mode to a second storage device 108, ready to assume the file system interface should the primary file server 104 for that storage device 108 fail.

Each file server 104 preferably contains a "Remote Management" interface. An example of such an interface is the "Base Management Controller" (BMC) on Intel Servers, which provides the ability to remotely configure, boot, power on/off, and monitor the file server 104 via an Ethernet or serial connection to each file server 104. Furthermore, each file server 104 preferably has a data connection such as a Gigabit Ethernet connection. This connection provides the interface, through a multi-port Gigabit Ethernet Switch, to the computer's 100 I/O nodes 106.

The storage devices 108 are preferably hot-swap SCSI disk cages, each containing multiple disk drives in a standard rack-mount frame. Preferably, the disk cages contain a multi-channel hardware RAID (Reliable Array of Inexpensive Disks) controller, redundant power supplies, and two external SCSI bus connections. The hardware RAID controller preferably groups multiple disk drives into RAID "stripe sets" and supports several stripe-set configurations ranging from RAID-0 (simple striping without protection) through RAID-5 (block-rotational striping with parity protection). A higher level of RAID can also be supported by this hardware organization, called "spanning" where multiple RAID strip-sets are striped together across a larger array of disk drives. An example of this is RAID-50 where two or more RAID-5 stripe-sets are themselves striped across a larger cluster of disk drives. However, RAID-5 is preferred because it provides the required reliability without incurring the added complexity and cost of a RAID-50 system for the small increment in reliability it provides.

Each file server 104 is connected to two or more storage devices 108, which are accessed via a "Twin-Tailed" SCSI interconnect, meaning that their internal SCSI bus interfaces on each end to a different host. In the event that any one of these file servers 104 fails, the one-to-one relationship of computer I/O nodes 106 to file server nodes 110 with direct interconnect to a particular storage device 108 is maintained through coordination of the I/O nodes 106 and the remaining file server nodes 110. Such coordination is accomplished by simultaneously switching the required number of file server nodes 110 from their primary twin-tailed connection (illustrated in solid lines) to their secondary connection (illustrated in dashed lines).

Figure 2:
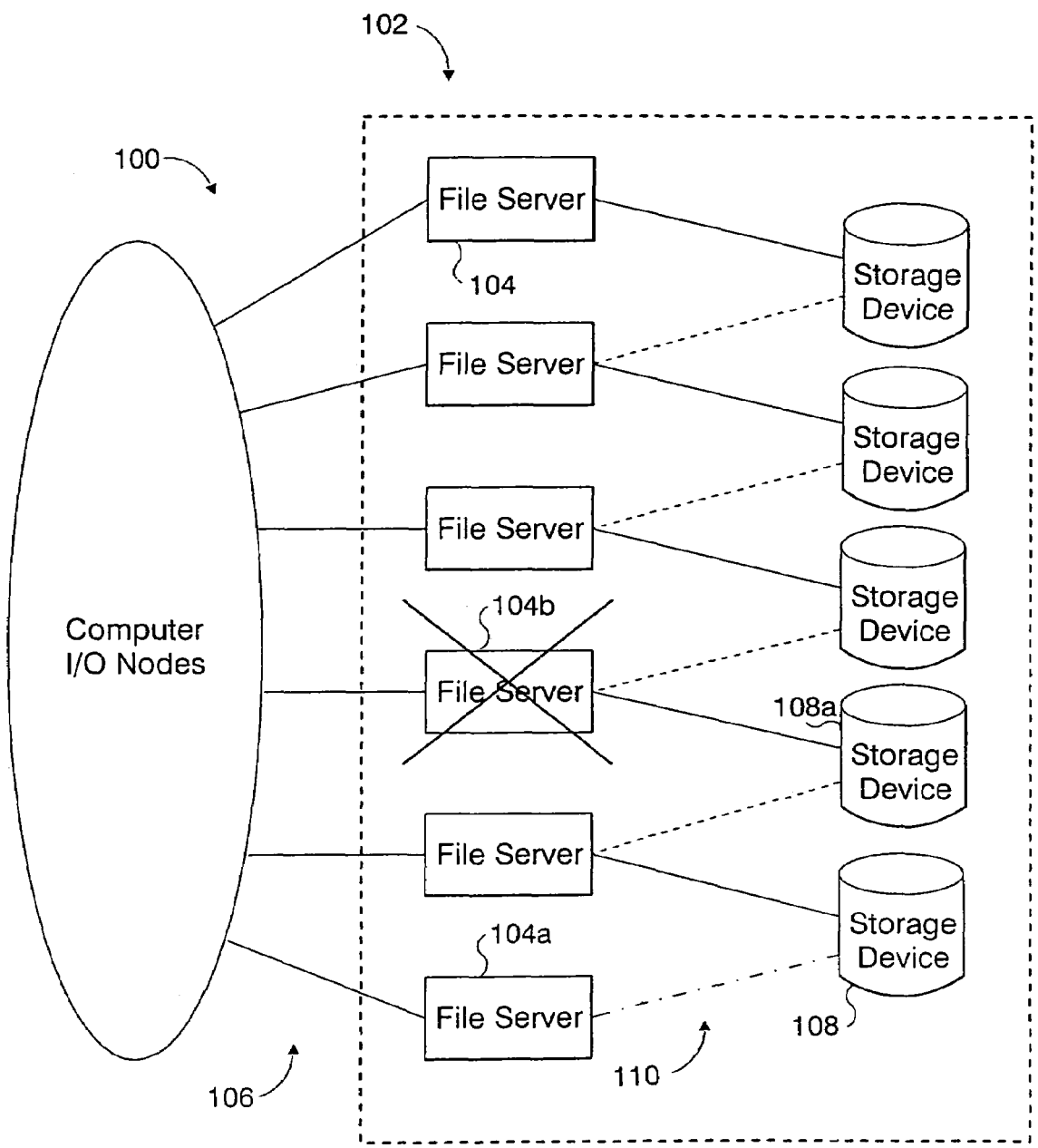
FIG. 2 illustrates the computing system of FIG. 1 in which a file server of the file system has failed.

As will be seen in the following examples, depending on which file server 104 has failed, anywhere from zero to the number of remaining file server nodes minus one (110) will switch, i.e., fail-over, to their secondary connection. On average, half of the file server nodes 110 will be required to switch. In this way, each storage device 108 continues to have one working file server 104 corresponding to it. Simultaneous with the fail-over of the file server nodes 110, the computer I/O nodes 106 will also switch their logical connection to a particular storage device 108 by switching which file server 104 they use to perform I/O to a particular file system. As shown in FIG. 2, upon the failure of file server 104*b*, the secondary connection to the spare file server 104*a* becomes a primary connection and storage device 108*a* switches its primary connection with the failed file server 104*b*. Those skilled in the art will realize that there is no loss in performance (bandwidth) and that the load on each of the file servers 104 is equal, assuming that the load generated from the Computer I/O nodes is equal. Those skilled in the art will also realize that the entire fail-over method is transparent to the application, in terms of both total performance and I/O connectivity: This is because the computer I/O nodes 106 transparently maintain direct connections to each storage device 108 and redirect that connectivity in a coordinated fashion upon any failure.

Figure 3:
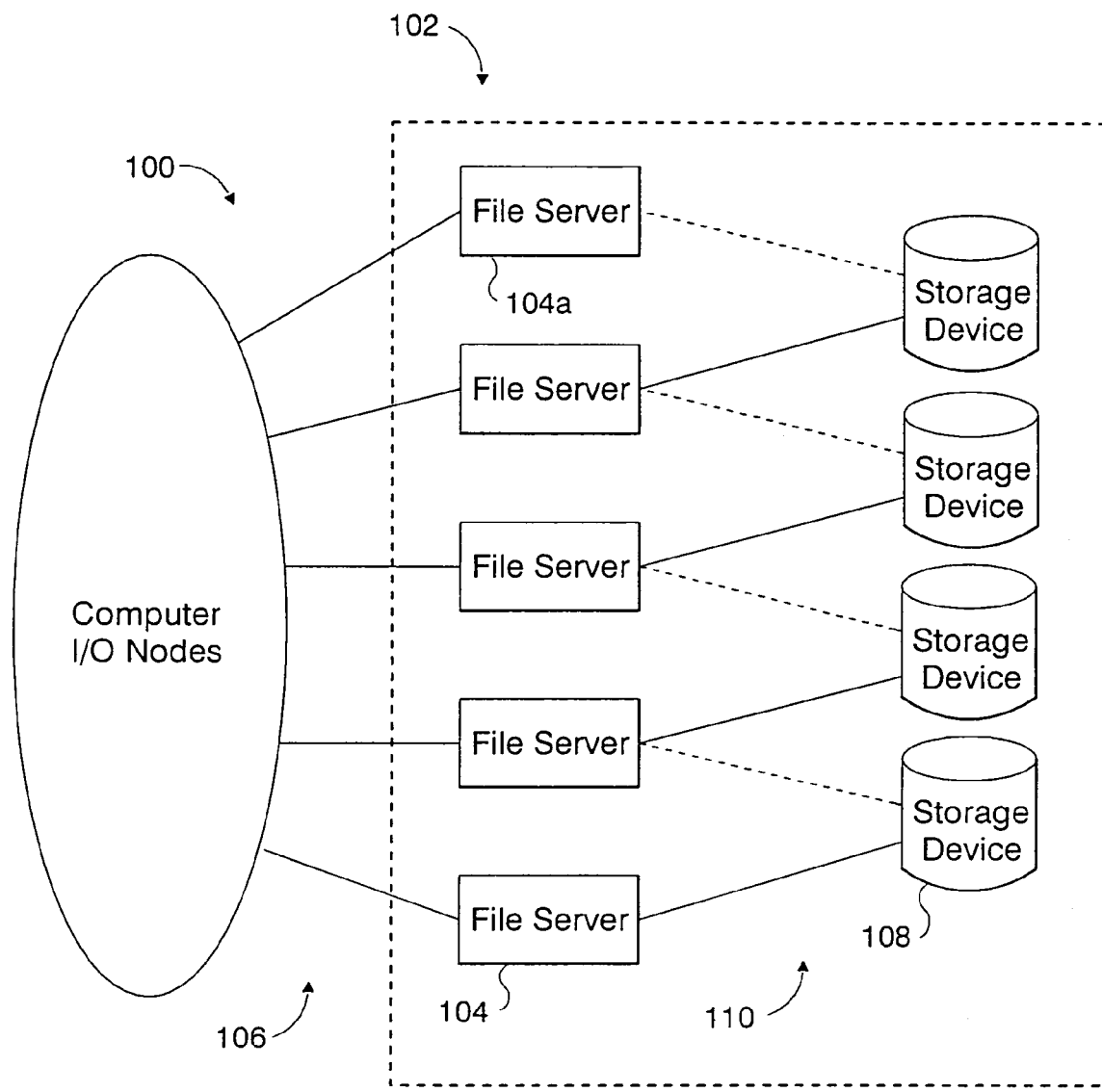
FIG. 3 is a schematic illustration of the file system of FIG. 1 having five file servers and four storage devices.

Referring now to FIG. 3, an example of a file system 102 of the present invention is illustrated therein having four (N) storage devices 108 and five (N+1) file servers 104. Preferably, each file server 104 is a PC and each storage device 108 is an independent RAID-5 unit. The number of storage devices 108 matches the number of I/O nodes 106. Each storage device 108 has two external SCSI bus connections as discussed above. One SCSI connection connects to a primary file server 104, the other to a different secondary file server 104. The middle file servers 104 thus serve as a primary file server 104 for one storage device 108 and as secondary file server 104 for another storage device 108. Only the primary file server 104 actively serves a storage device 108, but if the primary fails, the secondary file server 104*a* takes over. The file servers 104 thus reliably translate between the SCSI or other disk protocol of a storage device 108 and the Ethernet or other networking protocol of the I/O node 106. If four (N) file servers 104 were to be utilized, upon the failure of one of the file servers 104, its secondary file server 104 would continue to also act as a primary file server 104 for another storage device 108. Performance to the affected storage devices 108 thus may be reduced by a factor of two. In order to avoid this performance reduction, as discussed above, an "N/N+1 Fail-Over Cluster" scheme is used, where N is the number of storage devices 108 and N+1 is the number of file servers 104.

Figure 4:
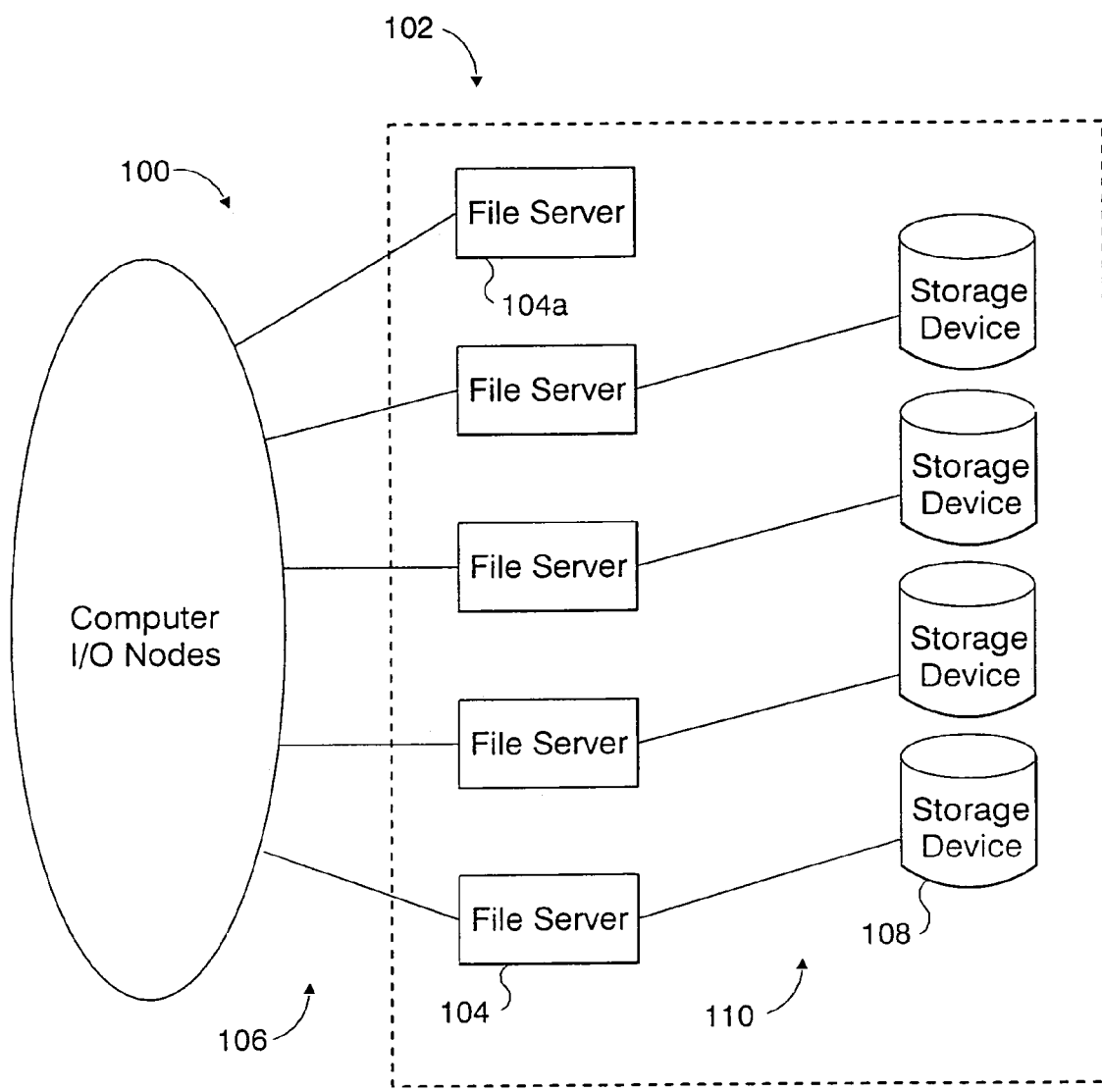
FIG. 4 illustrates the file system of FIG. 3 where all of the primary file servers are working properly.
Figure 5:
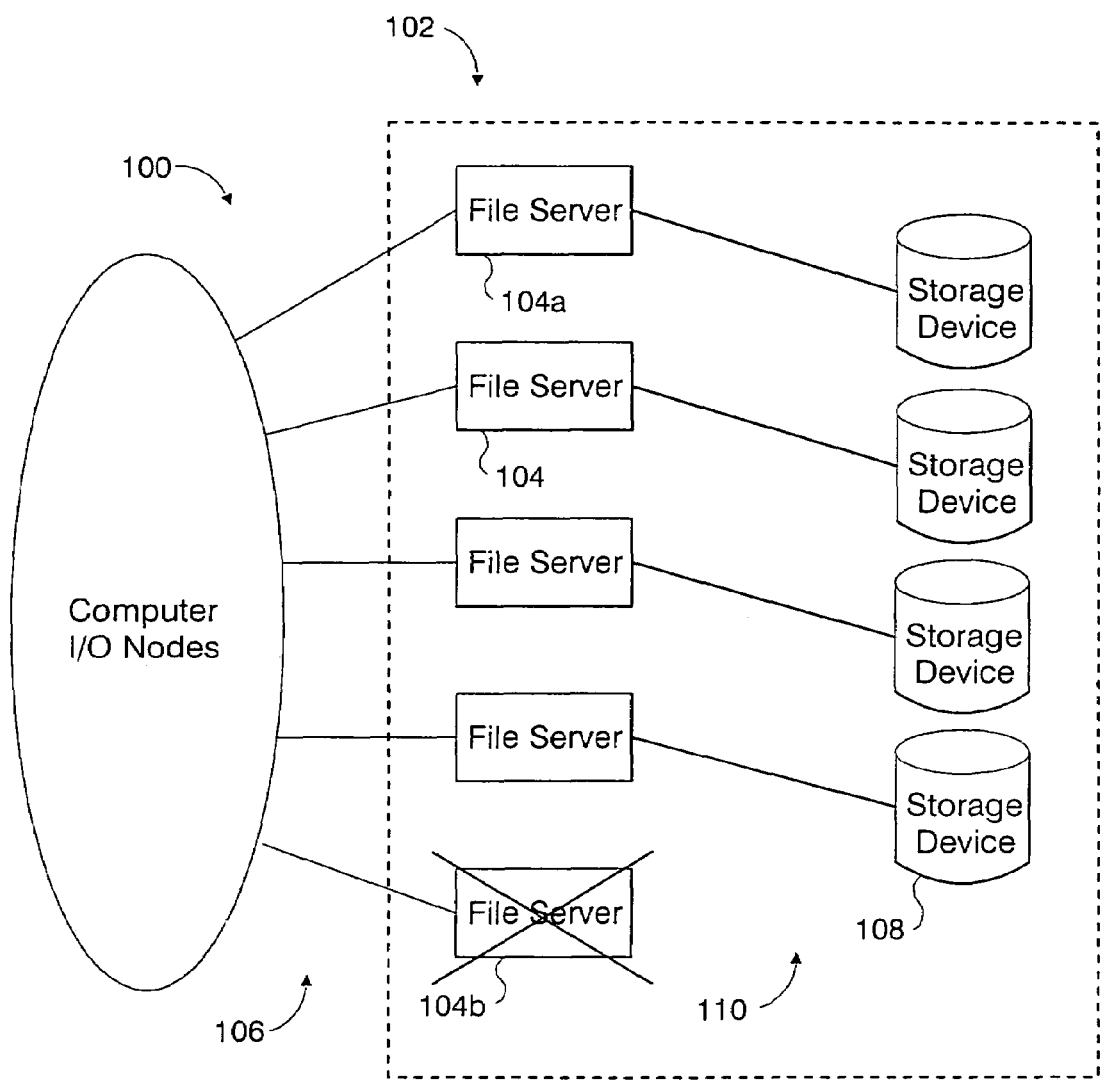
FIG. 5 illustrates the file system of FIG. 3 in which an end file server is failed.
Figure 6:
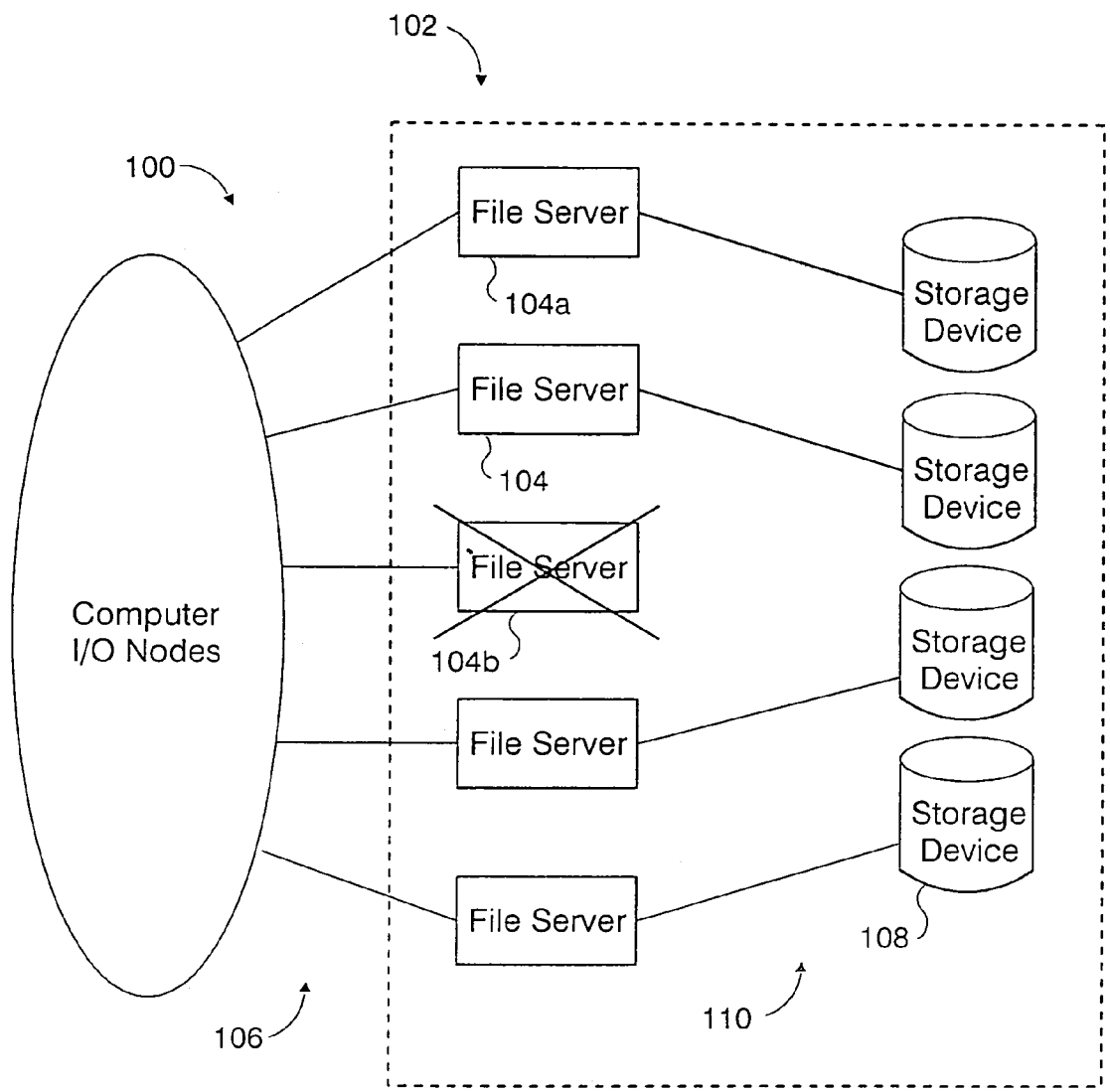
FIG. 6 illustrates the file system of FIG. 3 in which a middle file server is failed.

Assuming N=4, the storage devices 108 and file servers 104 of the 4/5 fail-over cluster are arranged as shown in FIG. 3 where a solid line indicates a primary connection and a dotted line indicates a secondary connection for each storage device 108. Where all the primary file servers 104 are working properly, the active file servers are as illustrated in FIG. 4. If the left-most file server 104*b* fails, then the secondary file servers 104 are used as shown in FIG. 5. If the middle file server 104*b* fails, then the connections are as illustrated in FIG. 6.

As demonstrated by the above examples, for each storage device 108, only one of its SCSI connections to a file server 104 is active. If a file server 104*b* fails, its corresponding storage device 108 switches to another file server 104. If that file server 104 was serving another storage device 108, that service is moved to the neighboring file server 104. Its neighbor does the same, if necessary, resulting in each file server 104 serving only a single storage device 108. Thus the failure of a file server 104, depending on its position in the N/N+1 fail-over cluster, causes between 1 and N storage devices 108 to move to a different file server 104. Any I/O node 106 of such a file server 104 thus must use a different file server 104.

Those skilled in the art will realize that a file system 102 may be configured according to the present invention in which each storage device 108 is connected to more than two file servers 104, for example to three file servers 104, a primary file server and two secondary file servers. Those skilled in the art will appreciate that if a file server 104 were to fail in such a configuration, its corresponding storage device 108 could switch to another file server 104 and cause a minimum amount of switching among the remaining storage devices 108.

The methods of the present invention are particularly suited to be carried out by a computer software program, such computer software program preferably containing modules corresponding to the individual steps of the methods. Such software can of course be embodied in a computer-readable medium, such as an integrated chip or a peripheral device.

While there has been shown and described what is considered to be preferred embodiments of the invention, it will, of course, be understood that various modifications and changes in form or detail could readily be made without departing from the spirit of the invention. It is therefore intended that the invention be not limited to the exact forms described and illustrated, but should be constructed to cover all modifications that may fall within the scope of the appended claims.

What is claimed is:

1. A file system for a computer, the file system comprising:
   N storage devices, where N is an integer greater than zero;
   N primary file servers, each file server being operatively connected to a corresponding storage device for accessing files therein; and
   a secondary file server operatively connected to at least one of the N storage devices;
   wherein upon a failure of one of the N primary file servers, one of the N storage devices switches its connection to the secondary file server and one or more of the storage devices that have not switched switch their connections to a primary file server other than the failed file server as necessary so as to prevent a loss in performance and to provide each storage device with an operating file server in a one-to-one relationship.

2. The file system of claim 1, wherein each of the N storage devices comprises a plurality of disk drives.

3. The file system of claim 2, wherein the plurality of disk drives comprises a reliable array of inexpensive disks (RAID).

4. The file system of claim 1, wherein each of the N primary and the secondary file servers are a PC.

5. The file system of claim 1, wherein at least one of the N storage devices has first and second connections, the first connection operatively connecting the storage device to one of the primary file servers and the second connection operatively connecting the storage device to the secondary file server.

6. The file system of claim 5, wherein the first and second connections are SCSI bus connections.

7. The file system of claim 6, wherein at least one of the primary and the secondary file servers have a two-channel SCSI controller, one of the two-channels being operatively connected to one of the N storage devices and the other of the two-channels being operatively connected to another of the N storage devices.

8. A computer system comprising:
   I/O nodes operatively connected to a file system;
   the file system comprising, N storage devices, where N is an integer greater than zero, N primary file servers, each file server being operatively connected to a corresponding storage device for accessing files therein; and a secondary file server operatively connected to at least one of the N storage devices, wherein upon a failure of one of the N primary file servers, one of the N storage devices switches its connection to the secondary file server and one or more of the storage devices that have not switched switch their connections to a primary file server other than the failed file server as necessary so as to prevent a loss in performance and to provide each storage device with an operating file server in a one-to-one relationship.

9. The computer system of claim 8, wherein each of the N storage devices comprises a plurality of disk drives.

10. The computer system of claim 9, wherein the plurality of disk drives comprises a reliable array of inexpensive disks (RAID).

11. The computer system of claim 8, wherein each of the N primary and the secondary file servers are a PC.

12. The computer system of claim 8, wherein at least one of the N storage devices has first and second connections, the first connection operatively connecting the storage device to one of the primary file servers and the second connection operatively connecting the storage device to the secondary file server.

13. The computer system of claim 12, wherein the first and second connections are SCSI bus connections.

14. The computer system of claim 13, wherein at least one of the primary and the secondary file servers have a two-channel SCSI controller, one of the two-channels being operatively connected to one of the N storage devices and the other of the two-channels being operatively connected to another of the N storage devices.

15. A method for maintaining full performance of a file system in the presence of a failure, the file system having N storage devices, where N is an integer greater than zero, N primary file servers, each file server being operatively connected to a corresponding storage device for accessing files therein, and a secondary file server operatively connected to at least one of the N storage devices, the method comprising:
   switching the connection of one of the N storage devices to the secondary file server upon a failure of one of the N primary file servers; and
   switching the connections of one or more of the storage devices that have not switched, to a primary file server other than the failed file server as necessary so as to prevent a loss in performance and to provide each storage device with an operating file server in a one-to-one relationship.

16. A computer program product embodied in a computer-readable medium for maintaining full performance of a file system in the presence of a failure, the file system having N storage devices, where N is an integer greater than zero, N primary file servers, each file server being operatively connected to a corresponding storage device for accessing files therein, and a secondary file server operatively connected to at least one of the N storage devices, the computer program product comprising:
   computer readable program code means for switching the connection of one of the N storage devices to the secondary file server upon a failure of one of the N primary file servers; and
   computer readable program code means for switching the connections of one or more of the storage devices that have not switched, to a primary file server other than the failed file server as necessary so as to prevent a loss in performance and to provide each storage device with an operating file server in a one-to-one relationship.

17. A program storage device readable by machine, tangibly embodying a program of instructions executable by the machine to perform method steps for maintaining full performance of a file system in the presence of a failure, the file system having N storage devices, where N is an integer greater than zero, N primary file servers, each file server being operatively connected to a corresponding storage device for accessing files therein, and a secondary file server operatively connected to at least one of the N storage devices, the method comprising:
   switching the connection of one of the N storage devices to the secondary file server upon a failure of one of the N primary file servers; and
   switching the connections of one or more of the storage devices that have not switched, to a primary file server other than the failed file server as necessary so as to prevent a loss in performance and to provide each storage device with an operating file server in a one-to-one relationship.

* * * * *